United States Patent
Tsutsumi et al.

(10) Patent No.: US 8,786,172 B2
(45) Date of Patent: Jul. 22, 2014

(54) FLUORESCENT MEMBER AND LIGHT EMITTING MODULE

(71) Applicant: Koito Manufacturing Co., Ltd., Tokyo (JP)

(72) Inventors: Yasuaki Tsutsumi, Shizuoka (JP); Masanobu Mizuno, Shizuoka (JP); Takashi Onishi, Shizuoka (JP)

(73) Assignee: Koito Manufacturing Co., Ltd., Tokyo (JP)

( * ) Notice: Subject to any disclaimer, the term of this patent is extended or adjusted under 35 U.S.C. 154(b) by 0 days.

(21) Appl. No.: 13/715,385

(22) Filed: Dec. 14, 2012

(65) Prior Publication Data

US 2013/0127331 A1    May 23, 2013

Related U.S. Application Data

(63) Continuation of application No. PCT/JP2011/003575, filed on Jun. 22, 2011.

(30) Foreign Application Priority Data

Aug. 6, 2010  (JP) ................................. 2010-177144

(51) Int. Cl.
*H05B 33/00* (2006.01)

(52) U.S. Cl.
USPC ....... 313/498; 362/311.09; 362/260; 362/326

(58) Field of Classification Search
None
See application file for complete search history.

(56) References Cited

U.S. PATENT DOCUMENTS

| | | | |
|---|---|---|---|
| 2007/0267646 A1* | 11/2007 | Wierer et al. | 257/98 |
| 2009/0057698 A1* | 3/2009 | Okamura et al. | 257/98 |
| 2011/0050082 A1* | 3/2011 | Inoue et al. | 313/483 |

FOREIGN PATENT DOCUMENTS

| | | |
|---|---|---|
| EP | 2176892 A1 | 4/2010 |
| JP | 2006005367 A | 1/2006 |
| JP | 2007123943 A | 5/2007 |
| JP | 2008021868 A | 1/2008 |
| JP | 2008502131 A | 1/2008 |
| JP | 2009200522 A | 9/2009 |
| JP | 2010080553 A | 4/2010 |
| WO | 2006093011 A1 | 9/2006 |

OTHER PUBLICATIONS

International Preliminary Report on Patentability, Mar. 12, 2013, 13 pages.
International Search Report, Oct. 4, 2011, 5 pages.

\* cited by examiner

*Primary Examiner* — Ashok Patel
(74) *Attorney, Agent, or Firm* — Buchanan Ingersoll & Rooney PC

(57) ABSTRACT

In a plate-shaped fluorescent member configured to convert the wavelength of the light emitted by a semiconductor light emitting element, the fluorescent member is formed of an inorganic material having a refractive index of 1.5 or more and a light transmittance at the emission peak wavelength of the semiconductor light emitting element of less than 20%. A concave portion is formed, of the surfaces of the fluorescent member, on the surface on the side where the light in the semiconductor light emitting element is mainly emitted. In the fluorescent member, the light transmittance of the light having a wavelength of 380 nm to 500 nm may be less than 20%. The concave portion may be a groove. The concave portion may be a plurality of holes that are scattered.

5 Claims, 14 Drawing Sheets

US 8,786,172 B2

FLUORESCENT MEMBER AND LIGHT EMITTING MODULE

CROSS-REFERENCE TO RELATED APPLICATIONS

This application is based upon and claims the benefit of priority from the prior Japanese Patent Application No. 2010-177144, filed on Aug. 6, 2010, and International Patent Application No. PCT/JP 2011/003575, filed on Jun. 22, 2011, the entire content of each of which is incorporated herein by reference.

BACKGROUND OF THE INVENTION

1. Field of the Invention

The present invention relates to a fluorescent member to be used in a light emitting module including a light emitting element, such as a light emitting diode.

2. Description of the Related Art

Conventionally, a light emitting device has been developed, in which the light emitted by an LED (Light Emitting Diode) is released outside after the wavelength thereof has been converted by a ceramic phosphor. As a phosphor to be used in such a light emitting device, for example, a ceramic phosphor is known, in which the minimum of a light transmittance at a wavelength of 420 nm to 500 nm is 20% or more and 80% or less (see International Patent Publication Pamphlet No. 06/093011).

However, the aforementioned ceramic phosphor has the minimum of a light transmittance at a wavelength of 420 nm to 500 nm is 20% or more, and hence a further improvement is required from the viewpoint of absorbing, by the phosphor, the light emitted by a semiconductor light emitting element.

SUMMARY OF THE INVENTION

The present invention has been made in view of these situations, and a purpose of the invention is to provide a fluorescent member by which a light extraction efficiency is improved.

In order to solve the aforementioned problem, a fluorescent member according to an embodiment of the present invention is a plate-shaped fluorescent member configured to convert the wavelength of the light emitted by a semiconductor light emitting element. The fluorescent member is formed of an inorganic material having a refractive index of 1.6 or more and a light transmittance at the emission peak wavelength of the semiconductor light emitting element of less than 20%, and a concave portion is formed, of the surfaces of the fluorescent member, on the surface on the side where the light in the semiconductor light emitting element is mainly emitted.

BRIEF DESCRIPTION OF THE DRAWINGS

Embodiments will now be described, by way of example only, with reference to the accompanying drawings, which are meant to be exemplary, not limiting, and wherein like elements are numbered alike in several figures, in which.

DETAILED DESCRIPTION OF THE INVENTION

Figure 1:
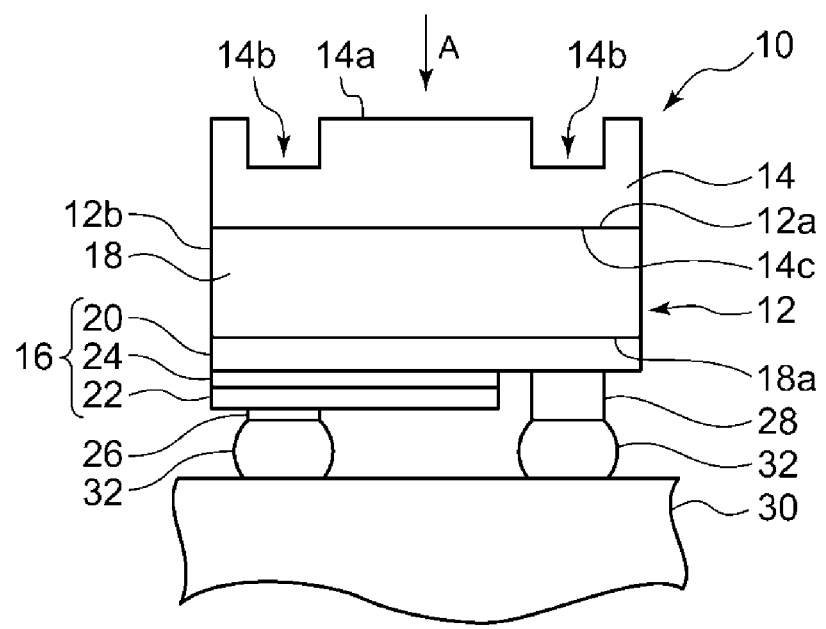
FIG. 1 is a sectional view schematically illustrating a light emitting module according to the present embodiment.

A fluorescent member according to an embodiment of the present invention is a plate-shaped fluorescent member configured to convert the wavelength of the light emitted by a semiconductor light emitting element. The fluorescent member is formed of an inorganic material having a refractive index of 1.6 or more and a light transmittance at the emission peak wavelength of the semiconductor light emitting element of less than 20%, and a concave portion is formed, of the surfaces of the fluorescent member, on the surface on the side where the light in the semiconductor light emitting element is mainly emitted.

According to the embodiment, an efficiency of converting, by the fluorescent member formed of an inorganic material, the wavelength of the light emitted by a semiconductor light emitting element is increased. In the fluorescent member having a refractive index of 1.6 or more, a critical angle at the interface with air is relatively small. Accordingly, of the light incident on the interface, the light having an incident angle larger than the critical angle cannot be emitted outside the fluorescent member due to total reflection. Therefore, by forming, of the surfaces of the fluorescent member, a concave portion on the surface on the side where the light in the semiconductor light emitting element is mainly emitted, it becomes possible to make the incident angle of the light to be incident on the interface to be partially different from before, thereby allowing a light extraction efficiency to be more improved in comparison with the case where the surface on the light emission side is flat without a concave portion.

In the fluorescent member, the minimum of the light transmittance of the light having a wavelength of 420 nm to 500 nm may be less than 20%. Thereby, when the fluorescent member is formed, for example, of a material for converting blue light into yellow light, white light having a high luminous efficiency can be obtained.

The concave portion may be a groove. Thereby, a concave portion can be simply formed.

The concave portion may be a plurality of holes that are scattered. Thereby, it becomes easy to form concave portions to be scattered at desired positions. An electrode is generally formed on any one of the surfaces of a semiconductor light emitting element. Because light is not emitted, by a semiconductor light emitting element, in part of a region where an electrode is formed, the ratio of the light whose wavelength has been converted becomes large in a fluorescent member located in the upper area of such an electrode (on the light emission side). Accordingly, it becomes a cause by which uneven color is created between the upper area of an electrode and another area. Therefore, by forming, for example, a plurality of holes in an area of the fluorescent member, the area facing the electrode, the fluorescent member in the area is reduced, thereby allowing uneven color to be reduced.

The depth of the concave portion may be 5 μm or more. Thereby, the light that is incident on the interface that forms the concave portion is increased, and hence a light extraction efficiency can be further improved.

The thickness of the fluorescent member at the bottom of the concave portion may be 70 μm or less.

Another embodiment of the present invention is a light emitting module. This light emitting module comprises a semiconductor light emitting element and the fluorescent member provided so as to face the light emitting surface of the semiconductor light emitting element.

According to the embodiment, an efficiency of converting, by the fluorescent member formed of an inorganic material, the wavelength of light emitted by the semiconductor light emitting element is increased. Further, in the fluorescent member having a refractive index of 1.6 or more, a critical angle at the interface with air is relatively small. Accordingly, of the light incident on the interface, the light having an incident angel larger than the critical angle cannot be emitted outside the fluorescent member due to total reflection. Therefore, by forming, of the surfaces of the fluorescent member, a concave portion on the surface on the side where the light in the semiconductor light emitting element is mainly emitted, it becomes possible to make the incident angle of the light to be incident on the interface to be partially different from before, thereby allowing a light extraction efficiency to be more improved in comparison with the case where the surface on the light emission side is flat without a concave portion. Accordingly, the luminous efficiency of the whole light emitting module can be improved.

In the fluorescent member, a concave portion may be formed at a position facing at least part of an electrode in the semiconductor light emitting element. For example, because light is not emitted, by the semiconductor light emitting element, in part of a region where an electrode is formed, the ratio of the light whose wavelength has been converted becomes large in a fluorescent member located in the upper area of such an electrode. Accordingly, it becomes a cause by which uneven color is created between the upper area of an electrode and another area. Therefore, by forming, for example, a concave portion in an area of the fluorescent member, the area facing the electrode, the fluorescent member in the area is reduced, thereby allowing uneven color in the whole fluorescent member to be reduced.

In the fluorescent member, a concave portion may be formed in an area outside the outer circumference of the semiconductor light emitting element that the fluorescent member faces. In the fluorescent member located outside the outer circumference of the semiconductor light emitting element, the ratio of converted light emitted by the semiconductor light emitting element, the wavelength of which has been converted, is larger than that of transmitted light emitted by the semiconductor light emitting element, the wavelength of which has not been converted, and hence the light is likely to have color closer to that of the converted light in comparison with the light in the fluorescent member located inside the outer circumference thereof. Accordingly, by forming a concave portion in an area outside the outer circumference of the semiconductor light emitting element that the fluorescent member faces, a light extraction efficiency can be improved, and uneven color can be reduced because the fluorescent member in the area is reduced.

Optional combinations of the aforementioned constituting elements and implementations of the invention in the form of methods, apparatuses, or systems may also be effective as additional modes of the present invention.

The invention will now be described by reference to the preferred embodiments. This does not intend to limit the scope of the present invention, but to exemplify the invention. In the description of the drawings, like elements will be denoted with like reference numerals and duplicative description will be appropriately omitted.

Figure 2:
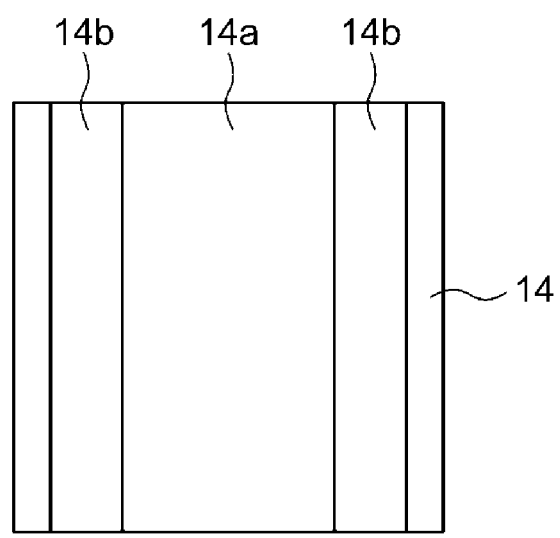
FIG. 2 is a top view of the light emitting module illustrated in FIG. 1, when viewed from the A direction.

FIG. 1 is a sectional view schematically illustrating a light emitting module according to the present embodiment. FIG. 2 is a top view of the light emitting module illustrated in FIG. 1, when viewed from the A direction.

As illustrated in FIG. 1, a light emitting module 10 according to the present embodiment comprises a semiconductor light emitting element 12 and a fluorescent member 14 provided so as to face the light emitting surface 12a of the semiconductor light emitting element 12.

[Semiconductor Light Emitting Element]

When the semiconductor light emitting element 12 is used in the light emitting module 10 that emits white light, for example, an LED, LD, or the like, which emits ultraviolet light, short-wavelength visible light, blue light, or the like, is suitable. In the present embodiment, the semiconductor light emitting element 12 has a structure in which a semiconductor layer 16 made, for example, of gallium nitride semiconductor has been grown on a sapphire substrate 18; and the semiconductor light emitting element 12 generates, in the semiconductor layer 16, blue light having a peak wavelength within a wavelength range of, for example, 420 nm to 500 nm. In addition, the semiconductor light emitting element 12 has both a light emitting surface 12a that intersects with the direction of the thickness of the semiconductor layer 16 (the surface 12a corresponds to the back surface of the sapphire substrate 18) and a side surface 12b along the edge of the light emitting surface 12a.

The blue light generated in the semiconductor layer 16 is emitted outside the semiconductor light emitting element 12 from the light emitting surface 12a and the side surface 12b. As illustrated in FIG. 1, the light emitting surface 12a according to the present embodiment is formed into a rectangular shape (square shape, oblong shape, etc.). The length d of one side of the light emitting surface 12a (in the case of an oblong shape, the length of the narrow side) is within a range of, for example, 300 μm to 1500 μm.

The semiconductor layer 16 is formed on the major surface 18a of the sapphire substrate 18 by epitaxial growth. In the semiconductor layer 16 according to the present embodiment, an n-type GaN layer 20 that functions as a first clad layer, a p-type GaN layer 22 that functions as a second clad layer, and a light emitting layer 24 sandwiched between the n-type GaN layer 20 and the p-type GaN layer 22 are laminated on the major surface 18a of the sapphire substrate 18. Alternatively, the semiconductor layer 16 may further have another layer (e.g., a buffer layer between the sapphire substrate 18 and the n-type GaN layer 20, etc.), in addition to the n-type GaN layer 20, the light emitting layer 24, and the p-type GaN layer 22.

The semiconductor light emitting element 12 further have an anode electrode 26 and a cathode electrode 28 for supplying power to the semiconductor layer 16. The anode electrode 26 is electrically connected to the p-type GaN layer 22 by ohmic contact therewith. In addition, the cathode electrode 28 is electrically connected to the n-type GaN layer 20 by ohmic contact with an exposed surface of the n-type GaN layer 20. The semiconductor light emitting element 12 is flip-chip mounted on a wiring board 30 by bonding, with solder 32, etc., the anode electrode 26 and the cathode electrode 28 to the wiring patterns on the wiring board 30.

When a voltage is applied between the anode electrode 26 and the cathode electrode 28, an electric field is generated between the two electrodes 26 and 28, and carriers generated in the n-type GaN layer 20 and the p-type GaN layer 22 concentrate on the light emitting layer 24. Thereby, blue light is generated in the light emitting layer 24. The blue light generated therein is transmitted through the transparent sapphire substrate 18 and emitted outside the semiconductor light emitting element 12 from the light emitting surface 12a and the side surface 12b.

[Fluorescent Member]

The fluorescent member 14 has a refractive index of 1.6 or more, and it is more preferable that the difference with the refractive index of the sapphire substrate 18 is small. In such a case, it can be suppressed that the light moving from the sapphire substrate 18 to the fluorescent member 14 may be totally reflected on the interface between the sapphire substrate 18 and the fluorescent member 14, thereby allowing an extraction efficiency of light to be improved. In the fluorescent member 14, a concave portion 14b is formed, of the surfaces of the fluorescent member 14, on the light emitting surface 14a on the side where the light in the semiconductor light emitting element is mainly emitted. The concave portion 14b according to the present embodiment is formed by a plurality of grooves formed on the upper surface of the fluorescent member 14, as illustrated in FIGS. 1 and 2.

In addition, the fluorescent member 14 is formed of an inorganic material whose light transmittance at the emission peak wavelength of the semiconductor light emitting element 12 is less than 20%. For example, a fluorescent member is used, in which the minimum of the light transmittance of the light having a wavelength of 420 nm to 500 nm is less than 20%. When the minimum of the light transmittance of the fluorescent member 14, at the emission peak wavelength of the semiconductor light emitting element 12, is less than 20%, most of the light emitted by the semiconductor light emitting element 12 is to be converted in the fluorescent member 14, that is, a conversion efficiency is increased. The lower limit of the light transmittance of the fluorescent member is not particularly limited, but it is better that the fluorescent member can be used, as a light emitting module, to an extent of not being practically problematic. The fluorescent member 14 is transparent in a wavelength range other than the emission peak wavelength of the semiconductor light emitting element 12. Herein, the expression: "the fluorescent member is transparent" can be understood as, for example, the case where the transmittance of the light having a wavelength is 40% or more.

Examples of the inorganic material include glass and ceramics each presenting a scintillation effect. When a fluorescent member is formed of a material by which blue light is converted into yellow light, white light having a high luminous efficiency can be obtained. Hereinafter, a fluorescent member formed of a ceramic material will de described as an example.

The light transmission of the fluorescent member 14 according to the present embodiment was measured by using ceramic whose both surfaces had been mirror polished. The measurement was performed in such a way that: the ceramic was set at a position 5 cm far from the light receiving area (incident hole of integrating sphere) in a spectrophotometer (Solid Spec-3700 made by Shimadzu Corporation), and the light was perpendicularly incident. Because the ceramic emits light after converting the wavelength of the light into the wavelength of the light emitted by the semiconductor light emitting element 12, the light receiver in the spectroscope senses it to indicate a transmittance value higher than the real transmittance. Accordingly, the ceramic was set at a position 5 cm far from the light receiving area, in order not to make the light whose wavelength has been converted to be incident. Thereby, the true transmittance of the ceramic can be measured. The transmittance described herein means a linear transmittance in the direction of the thickness t from the later-described light incident surface to the light emitting surface 14a of the fluorescent member 14 (the ratio of an emitting light intensity to an incident light intensity).

The fluorescent member 14 according to the present embodiment is a plate-shaped member that converts the wavelength of the light emitted by the semiconductor light emitting element 12. The fluorescent member 14 contains a fluorescent substance and is provided on the light emitting surface 12a of the semiconductor light emitting element 12. The fluorescent member 14 is excited by the blue light emitted by the semiconductor light emitting element 12 and emits yellow light, which is the complementary color of blue light. Accordingly, the light emitted from the surface of the fluorescent member 14 turns into white light based on the blue light transmitted through the fluorescent member 14 and the yellow fluorescence emitted by the fluorescent member 14. It is preferable that the fluorescence emitted by the fluorescent member 14 has a peak wavelength in a wavelength range of, for example, 510 nm or more to 600 nm or less.

As stated above, the fluorescent member 14 according to the present embodiment is made of a ceramic sintered body formed only of a single inorganic material. The expression: "formed only of a single inorganic material" described herein means that an organic substance, such as a resin, is not substantially contained in the phosphor and the phosphor is formed of one type of homogeneous inorganic material. The "light emitting surface" means a surface of the fluorescent member 14 from which light is emitted.

For convenience, assuming that the semiconductor light emitting element 12 is arranged near to the back surface 14c of the fluorescent member 14 illustrated in FIG. 1, the back surface 14c is made to be a surface on which the light from the semiconductor light emitting element 12 is incident (hereinafter, referred to as a light incident surface) and the surface from which color-mixed light is emitted is made to be a light emitting surface 14a, in the present embodiment.

The fluorescent member 14 according to the present embodiment is formed only of a single inorganic material. Thus, the fluorescent member 14 is formed only of one type of homogeneous inorganic material not containing a resin, etc., and hence it can be prevented that, due to deterioration of a resin, the emission intensity may be decreased or the life of the fluorescent member 14 may be shortened.

Further, because the fluorescent member 14 is formed only of one type of homogeneous inorganic material, light scattering in the fluorescent member 14 is extremely little, and an amount of light returning toward the semiconductor light emitting element 12 (a reflection amount) can be made small. Accordingly, the luminance of the light emitting diode can be made large.

The inorganic material according to the present embodiment is formed of a single phase of YAG containing Ce. Further, the phosphor according to the embodiment is formed of a ceramic sintered body. Accordingly, the fluorescent member 14 can have high heat resistance and high light resistance, and hence the life of the light emitting module 10 can be lengthened.

The fluorescence peak wavelength described herein means, when the fluorescent member 14 is formed of Ce:YAG, a peak wavelength obtained in a wavelength range of 550 to 600 nm.

In the fluorescent member 14 according to the present embodiment, the concave portion 14b is formed, of the surfaces of the fluorescent member 14, on the surface 14a on the side where the light in the semiconductor light emitting element 12 is mainly emitted. Hereinafter, the reason why such the concave portion 14b is provided will be described in detail.

Figure 3A:
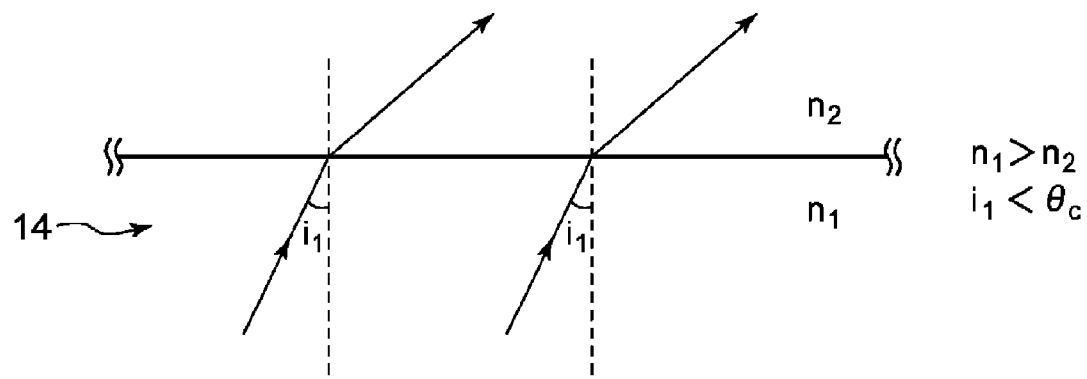
FIGS. 3(a) to 3(c) are schematic views for explaining refractions of light on the interfaces of substances having refractive indices different from each other.
Figure 3B:
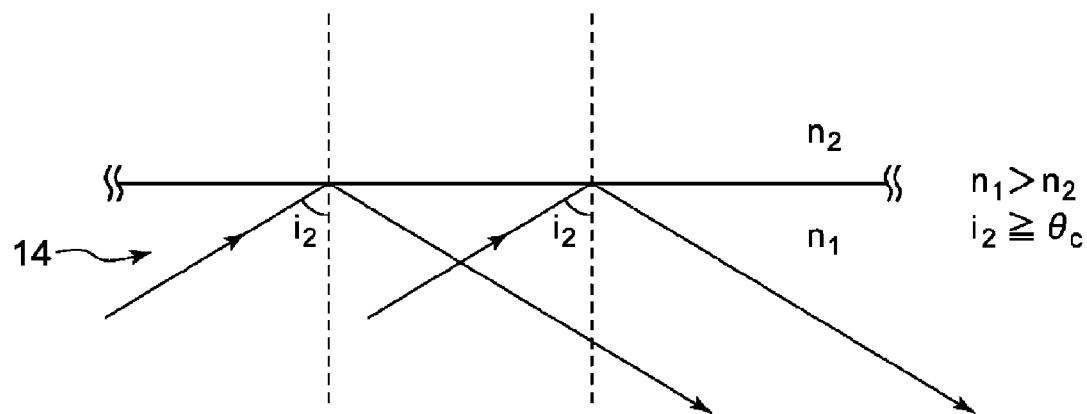
Figure 3C:
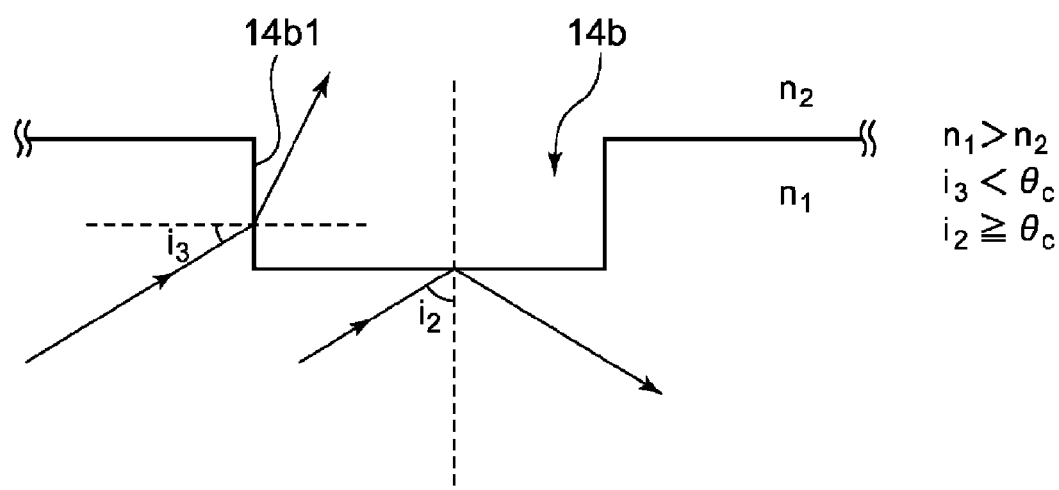

FIGS. 3(a) to 3(c) are schematic views for explaining refractions of light at the interfaces of substances having refractive indices different from each other. Each of FIGS. 3(a) to 3(c) illustrates the path of light traveling from a substance having a high refractive index (fluorescent member 14) to a substance having a low refractive index (air). As illustrated in FIG. 3(a), when an incident angle $i_1$ is smaller than a critical angle $\theta_c$, light is refracted and emitted from the fluorescent member 14. On the other hand, as illustrated in FIG. 3(b), when an incident angle $i_2$ is larger than or equal to the critical angle $\theta_c$, light is totally reflected and is not emitted outside. In particular, in the fluorescent member 14 having a refractive index of 1.6 or more, the critical angle on the interface with air is relatively small. Accordingly, the ratio of the light having an incident angle i larger than the critical angle $\theta_c$ to the light to be incident on the interface becomes relatively larger in comparison with a substance having a low refractive index, thereby causing a decrease in a light extraction efficiency.

Therefore, in the fluorescent member 14 according to the present embodiment, the concave portion 14b is provided on the surface thereof. The width of the concave portion 14b is constant from the opening on the surface of the fluorescent member 14 to the bottom. As illustrated in FIG. 3(c), inside the fluorescent member 14 in which the concave portion 14b is formed, when part of light, even if the light travels in the same direction as in FIG. 3(b), is incident on the side surface 14b1 of the concave portion 14b, there are sometimes the cases where an incident angle $i_3$ is smaller than the critical angle $\theta_c$. Accordingly, even the light, which cannot be emitted if the light emitting surface 14a of the fluorescent member 14 is completely flat, can be emitted outside. That is, it becomes possible to make the incident angle of the light to be incident on the interface to be partially different from before by the concave portion 14b, thereby allowing a light extraction efficiency to be further improved in comparison with the case where the surface on the side where light is emitted is flat without a concave portion. Accordingly, the luminous efficiency of the whole light emitting module 10 can be improved.

Figure 4A:
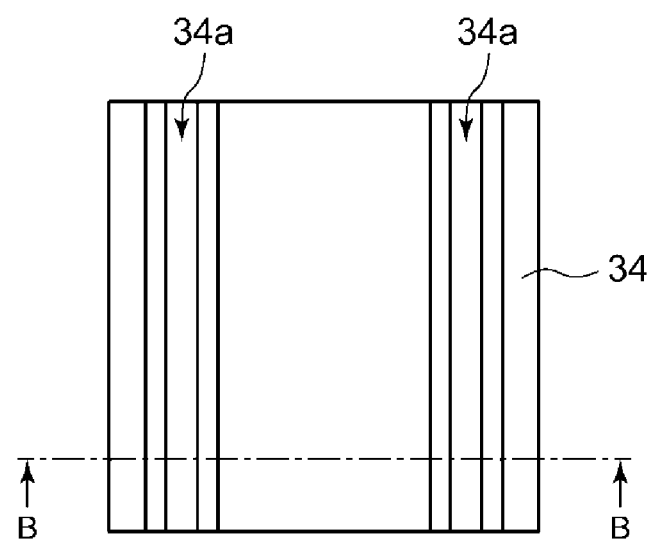
FIG. 4(a) is a top view of a fluorescent member illustrating a variation of a concave portion having a groove shape.
Figure 4B:
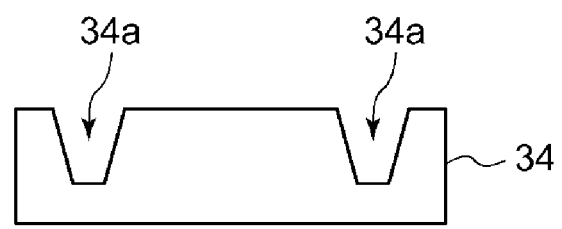
FIG. 4(b) is a sectional view of the fluorescent member illustrated in FIG. 4(a), taken along B-B Line.

Hereinafter, variations with respect to the shape and size of the concave portion will be further described in detail. FIG. 4(a) is a top view of a fluorescent member illustrating a variation of a concave portion having a groove shape, and FIG. 4(b) is a sectional view of the fluorescent member illustrated in FIG. 4(a), taken along B-B Line. As illustrated in FIGS. 4(a) and 4(b), a concave portion 34a of a fluorescent member 34 is a linear groove and the width of the groove becomes smaller as going from an opening on the surface of the fluorescent member 34 to the bottom. That is, the side surface of the concave portion 34a is oblique.

The concave portion having a groove shape can be formed, for example, by being half cut during a dicing process. In that case, the side surface of the concave portion can be processed to be oblique (tapered) by using a dicing blade whose tip has a V-shape or an oblique shape. Thus, a groove can be relatively easily formed as the concave portion.

Figure 5A:
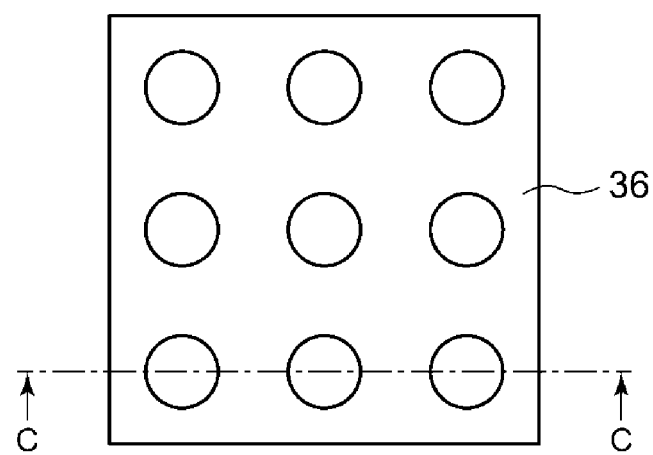
FIG. 5(a) is a top view of a fluorescent member in which a plurality of holes are formed as a concave portion.
Figure 5B:
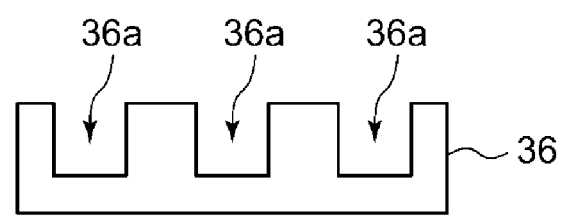
FIG. 5(b) is a sectional view of the fluorescent member illustrated in FIG. 5(a), taken along C-C Line.

Subsequently, another variation of the shape of the concave portion will be described in detail. FIG. 5(a) is a top view of a fluorescent member in which a plurality of holes are formed as the concave portion, and FIG. 5(b) is a sectional view of the fluorescent member illustrated in FIG. 5(a), taken along C-C Line. As illustrated in FIGS. 5(a) and 5(b), in a fluorescent member 36, a total of nine circular holes 36a are formed in a matrix pattern of 3 rows by 3 columns. Processing with the use of a drill or a laser is suitable for forming a hole as the concave portion.

EXAMPLES

Hereinafter, the present invention will be further specifically described based on the following examples, but the invention is not limited to these examples.

A method of manufacturing a fluorescent member to be used in each of the following examples will be first described in detail. Aluminum oxide powders with three nine purity (average particle diameter: 0.5 μm), yttrium oxide powders with three nine purity (average particle diameter: 0.6 μm), and cerium oxide powders (average particle diameter: 0.8 μm) were weighed so as to produce a composition of 1 at % Ce:YAG. Thereafter, 1 wt % of an acrylic resin binder whose dispersion liquid was ethanol and 0.5 wt % of colloidal silica as a sintering additive were added to the aforementioned weighed powders, and they were mixed together by a ball mill to produce a slurry. The obtained slurry was granulated by a spray dryer to produce granulated powders having a secondary particle diameter of approximately 50 μm. The granulated powders were formed into a molded article by metallic molding and cold hydrostatic molding, and the molded article was then degreased and calcined in the air at 1000° C.

Subsequently, the calcined molded article was fired at a temperature of approximately 1750 to 1800° C. to produce a Ce:YAG sintered body.

Subsequently, all of the fired sintered bodies were processed into plate-shaped bodies each having a predetermined thickness (150 μm or 250 μm). The light incident surface and light emitting surface of each plate-shaped body were mirror polished such that they were made into mirror surfaces each having a surface roughness (Ra) of 1.0 nm. Herein, the thickness of a fluorescent member may be appropriately set to be within a range of, for example, approximately 10 to 500 μm.

Subsequently, one surface of each of the sintered bodies, which serves as a light emitting surface, was cut to produce, as samples, fluorescent members in which various concave portions were formed. Further, as shown in each of the following examples and tables, samples each having a certain shape and a certain size of a concave portion, which are different from the others, were produced.

A fluorescent member formed of each of the obtained Ce:YAG sintered bodies was mounted on the semiconductor light emitting element 12 such that the light incident surface was located near to the semiconductor light emitting element 12. Thereafter, the luminance on the side of the light emitting surface of the fluorescent member was measured by lighting the semiconductor light emitting element 12.

Example 1

Figure 6:
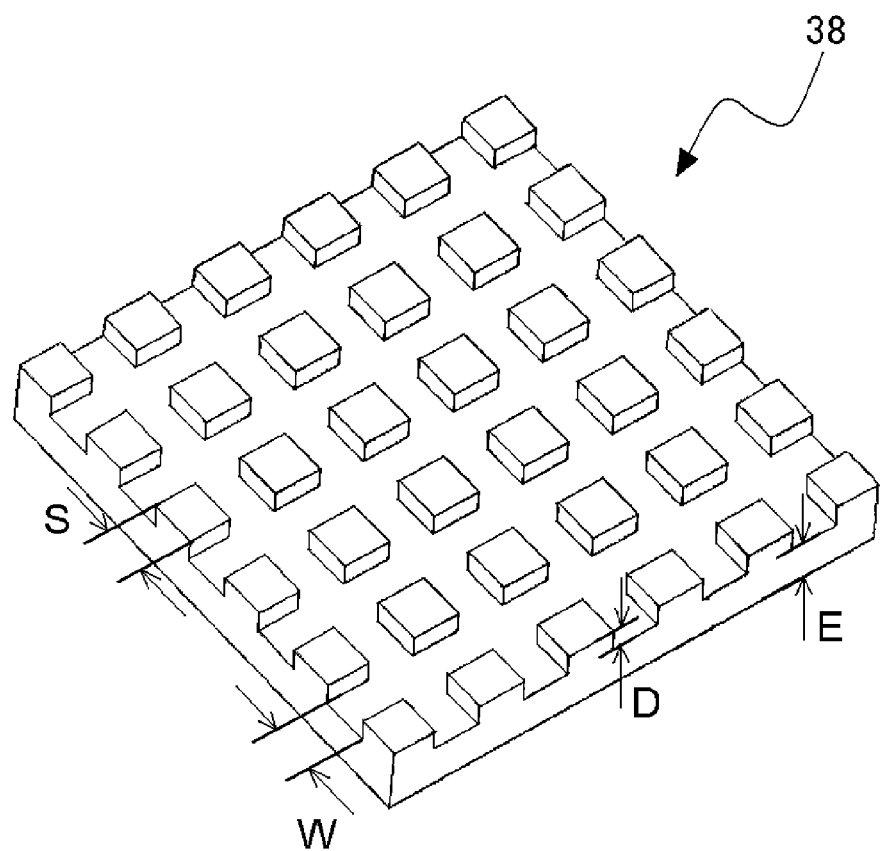
FIG. 6 is a perspective view of a fluorescent member according to Example 1, when viewed from the light emitting surface side.

FIG. 6 is a perspective view of a fluorescent member according to Example 1, when viewed from the light emitting surface side. In a fluorescent member 38 illustrated in FIG. 6, five grooves are formed in each of the vertical direction and the horizontal direction. The width of each of the grooves is uniform, independent of the depth. In Table 1, the followings are shown: Comparative Sample in which no concave portion is formed; Samples 1-1 to 1-4 in each of which the depth of the groove is different from the others; and the luminance of a light emitting module in which each of Comparative Sample and Samples 1-1 to 1-4 has been used. The luminance value obtained when each of the Samples has been used is a relative value when the luminance obtained when Comparative Sample has been used is assumed to be 1.00. In the fluorescent member 38 illustrated in FIG. 6, the depth D of the groove is 50 μm, the thickness E of the thinnest portion of the fluorescent member, the thinnest portion corresponding to the bottom of the groove, is 100 μm, the width W of the groove is 50 μm, and the width S of the unprocessed portion between the grooves is 50 μm; and the fluorescent member 38 corresponds to Sample 1-3.

surfaces (interfaces) that form the groove to be increased. As a result, it becomes possible to extract outside even the light, which cannot be emitted outside due to total reflection if the surface is flat, thereby allowing a light extraction efficiency to be further improved. Herein, it is preferable that the depth of the groove is 3 μm or more. If the depth is less than 3 μm, the ratio of the side surface of a groove is small, and hence an improvement in luminance cannot be expected too much. The depth of the groove is more preferably 5 μm or more, and still more preferably 25 μm or more. When the depth is 25 μm or more, 50% or more of improvement in luminance can be expected, as shown in Table 1.

Example 2

Figure 7:
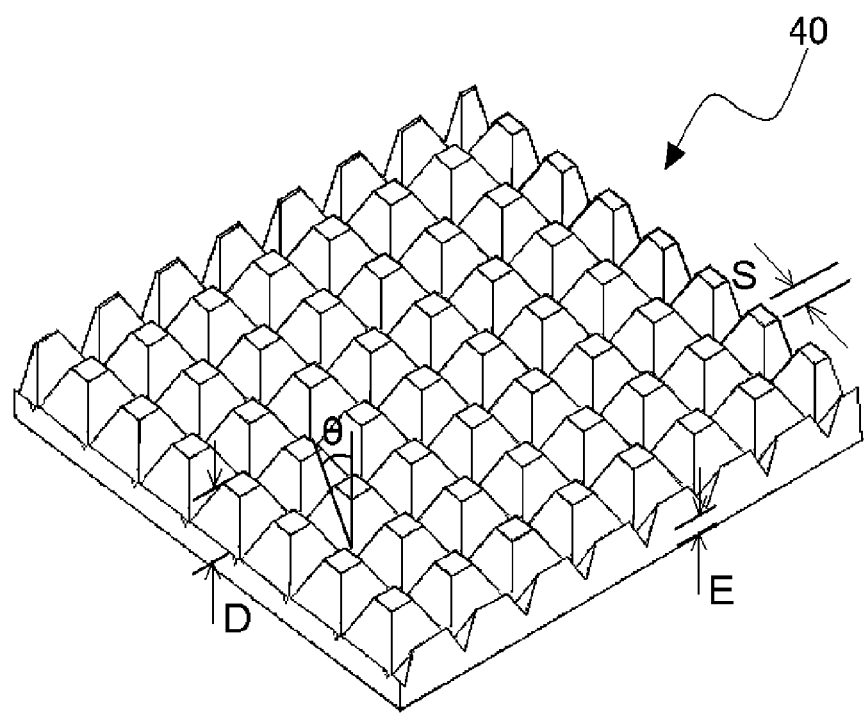
FIG. 7 is a perspective view of a fluorescent member according to Example 2, when viewed from the light emitting surface side.

FIG. 7 is a perspective view of a fluorescent member according to Example 2, when viewed from the light emitting surface side. In a fluorescent member 40 illustrated in FIG. 7, seven grooves are formed in each of the vertical direction and the horizontal direction. The groove is formed to be tapered such that the width thereof becomes smaller as going toward the bottom of the groove, that is, the cross section of the groove has an approximate V-shape. In Table 2, the followings are shown: Comparative Sample; Samples 2-1 to 2-9 in each of which the shape of the groove is different from the others; and the luminance of a light emitting module in which each of Comparative Sample and Samples 2-1 to 2-9 has been used. The luminance value obtained when each of the Samples has been used is a relative value when the luminance obtained when Comparative Sample has been used is assumed to be 1.00. In the fluorescent member 40 illustrated in FIG. 7, the tapered angle (angle between a line perpendicular to the surface of the fluorescent member and the side surface of the groove) is 25°, the depth D of the groove is 100 μm, the thickness E of the thinnest portion of the fluorescent member, the thinnest portion corresponding to the bottom of the groove, is 50 μm, the number of the grooves is 7 in each of the vertical direction and the horizontal direction, and the width S of the unprocessed portion between the grooves is 50 μm.

TABLE 1

| | SAMPLE NO. | | | | |
| --- | --- | --- | --- | --- | --- |
| | COMPARATIVE SAMPLE | SAMPLE 1-1 | SAMPLE 1-2 | SAMPLE 1-3 | SAMPLE 1-4 |
| DEPTH OF GROOVE: D [μm] | 0 | 3 | 25 | 50 | 100 |
| THINNEST PORTION: E [μm] | 150 | 147 | 125 | 100 | 50 |
| WIDTH OF GROOVE: W [μm] | 0 | 50 | 50 | 50 | 50 |
| NUMBER OF GROOVES (VERTICAL, HORIZONTAL) | 0 | 5 | 5 | 5 | 5 |
| LUMINANCE | 1.00 | 1.10 | 1.50 | 1.77 | 1.78 |

It can be known that, as shown in Table 1, a luminance is improved when a groove is provided, as a concave portion, on the light emitting surface of the fluorescent member 38. It can also be known that a luminance is more increased as the depth of the groove is larger. That is, the ratio of the side surface of the groove becomes larger by forming the groove having a larger depth, thereby allowing the light incident on the side

TABLE 2

| | SAMPLE NO. | | | | | | | | | |
| --- | --- | --- | --- | --- | --- | --- | --- | --- | --- | --- |
| | COMPARATIVE SAMPLE | SAMPLE 2-1 | SAMPLE 2-2 | SAMPLE 2-3 | SAMPLE 2-4 | SAMPLE 2-5 | SAMPLE 2-6 | SAMPLE 2-7 | SAMPLE 2-8 | SAMPLE 2-9 |
| TAPERED ANGLE [°] | 0 | 25 | 25 | 35 | 45 | 25 | 25 | 25 | 25 | 25 |
| DEPTH OF GROOVE: D [μm] | 0 | 70 | 100 | 100 | 100 | 25 | 50 | 125 | 145 | 150 |
| THINNEST PORTION: E [μm] | 150 | 80 | 50 | 50 | 50 | 125 | 100 | 25 | 5 | 0 |

TABLE 2-continued

| | SAMPLE NO. | | | | | | | | | |
|---|---|---|---|---|---|---|---|---|---|---|
| | COMPARATIVE SAMPLE | SAMPLE 2-1 | SAMPLE 2-2 | SAMPLE 2-3 | SAMPLE 2-4 | SAMPLE 2-5 | SAMPLE 2-6 | SAMPLE 2-7 | SAMPLE 2-8 | SAMPLE 2-9 |
| NUMBER OF GROOVES (VERTICAL, HORIZONTAL) | 0 | 5 | 5 | 5 | 5 | 16 | 12 | 7 | 7 | 7 |
| LUMINANCE | 1 | 1.52 | 1.93 | 1.95 | 2.02 | 1.63 | 1.77 | 2.42 | 2.56 | 2.89 |

It can be known that, as shown in Table 2, a luminance is improved when a groove is provided, as a concave portion, on the light emitting surface of the fluorescent member 40. It can also be known that a luminance is more increased as the depth of the groove is larger, as clear from the comparison, for example among Comparative Sample and Samples 2-1 and 2-2 or among Samples 2-7 to 2-9. That is, the ratio of the side surface of the groove becomes larger by forming the groove having a larger depth, thereby allowing the light incident on the side surfaces (interfaces) that form the groove to be increased. As a result, it becomes possible to extract outside even the light, which cannot be emitted outside due to total reflection if the surface is flat, thereby allowing a light extraction efficiency to be further improved.

It can be known from the comparison among Samples 2-2 to 2-4 that, even when the depths of the grooves are the same as each other, a luminance is more improved as the tapered angle becomes larger. Even when the number of the grooves and the depth of the groove are the same as those of the others, the area of the side surface of the groove becomes larger as the tapered angle becomes larger, and hence it can be considered that the ratio of the light to be extracted outside from the side surface of the groove may become large. As shown in Table 2, it is more preferable that the tapered angle is 25° or more. The larger the depth of the groove, the better. For example, as shown in Sample 2-9, when the depth of the groove is 150 μm, which is the same as the thickness of the fluorescent member 40, the luminance is 2.89 times larger than that of Comparative Sample, thereby it can be known that a light extraction efficiency is remarkably improved.

Subsequently, a change in luminance, occurring due to a difference between the thicknesses of fluorescent members will be considered. Table 3 shows comparisons of differences in luminance, the differences occurring due to the shapes of groove, when the total thickness of the fluorescent member is 250 μm.

As clear from the comparison between the luminance of Comparative Sample and that of Sample 2-10, which are both shown in Table 3, a luminance is more decreased as the thickness of the fluorescent member itself becomes larger. On the other hand, as clear from the comparison among Samples 2-10 to 2-12, a luminance is more improved as the depth of the groove is larger. That is, even in the case where the thickness of the fluorescent member itself is changed, the trend of the changes in luminance is identical.

Example 3

Figure 8:
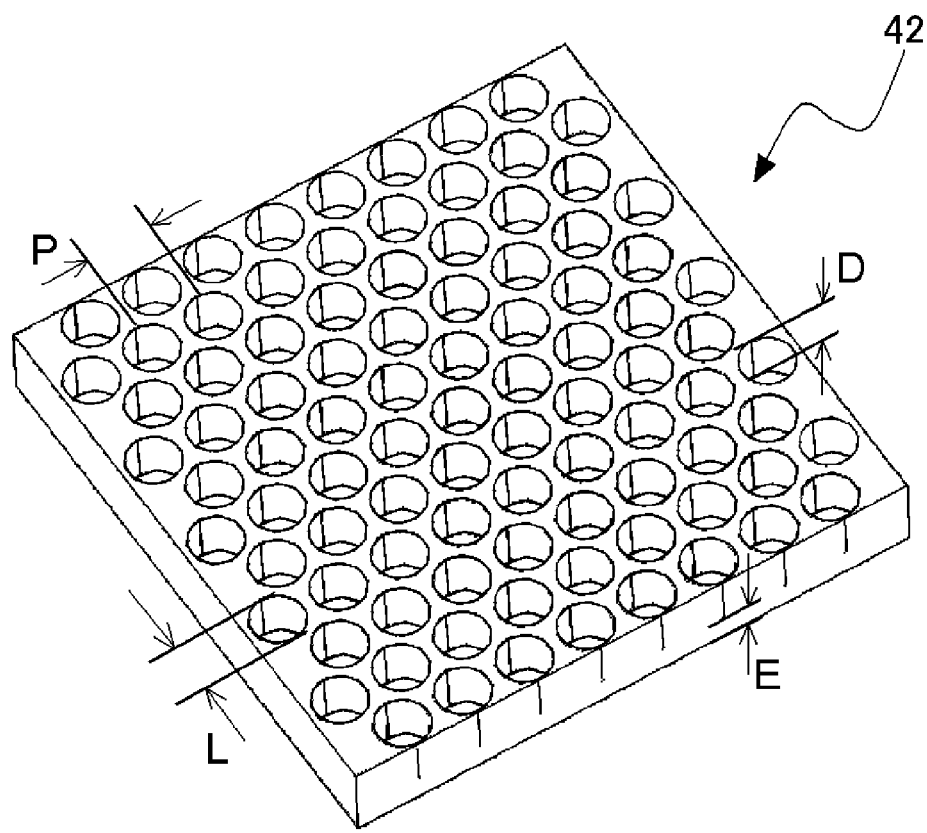
FIG. 8 is a perspective view of a fluorescent member according to Example 3, when viewed from the light emitting surface side.

FIG. 8 is a perspective view of a fluorescent member according to Example 3, when viewed from the light emitting surface side. In a fluorescent member 42 illustrated in FIG. 8, 93 holes arranged in a matrix pattern of vertical columns by horizontal rows are formed. The hole is formed such that the width thereof is the same through the bottom or becomes smaller as going toward the bottom. In Tables 4 and 5, the followings are shown: Comparative Sample; Samples 3-1 to 3-12 in each of which the shape of the groove is different from the others; and the luminance of a light emitting module in which each of Comparative Sample and Samples 3-1 to 3-12 has been used. The luminance value obtained when each of Samples has been used is a relative value when the luminance obtained when Comparative Sample has been used is assumed to be 1.00. In the fluorescent member 42 illustrated in FIG. 8, the tapered angle is 0° (hole is formed perpendicularly), the diameter L of the hole is 100 μm, the depth D of the hole is 100 μm, the thickness E of the thinnest portion of the fluorescent member, the thinnest portion corresponding to the bottom of the hole, is 50 μm, the number of the holes is 93, and the pitch P between the holes is 120 μm; and the fluorescent member 42 corresponds to Sample 3-8.

TABLE 3

| | SAMPLE NO. | | | |
|---|---|---|---|---|
| | COMPARATIVE SAMPLE | SAMPLE 2-10 | SAMPLE 2-11 | SAMPLE 2-12 |
| TAPERED ANGLE [°] | 0 | 0 | 25 | 25 |
| DEPTH OF GROOVE: D [μm] | 0 | 0 | 100 | 200 |
| THINNEST PORTION: E [μm] | 150 | 250 | 150 | 50 |
| NUMBER OF GROOVES (VERTICAL, HORIZONTAL) | 0 | 0 | 5 | 5 |
| LUMINANCE | 1.00 | 0.83 | 1.35 | 1.91 |

TABLE 4

| | SAMPLE NO. | | | | | | | |
|---|---|---|---|---|---|---|---|---|
| | COMPARATIVE SAMPLE | SAMPLE 3-1 | SAMPLE 3-2 | SAMPLE 3-3 | SAMPLE 3-4 | SAMPLE 3-5 | SAMPLE 3-6 | SAMPLE 3-7 |
| TAPERED ANGLE [°] | — | 0 (VERTICAL) | 0 (VERTICAL) | 0 (VERTICAL) | 0 (VERTICAL) | 0 (VERTICAL) | 0 (VERTICAL) | 0 (VERTICAL) |
| DIAMETER OF HOLE: L [μm] | 0 | 40 | 40 | 20 | 40 | 80 | 80 | 80 |
| DEPTH OF GROOVE: D [μm] | 0 | 25 | 25 | 25 | 25 | 25 | 50 | 100 |
| THINNEST PORTION E [μm] | 150 | 125 | 125 | 125 | 125 | 125 | 100 | 50 |
| NUMBER OF HOLES | 0 | 441 | 196 | 121 | 121 | 121 | 121 | 121 |
| LUMINANCE | 1 | 1.67 | 1.35 | 1.05 | 1.31 | 1.59 | 1.74 | 1.94 |

TABLE 5

| | SAMPLE NO. | | | | | |
|---|---|---|---|---|---|---|
| | COMPARATIVE SAMPLE | SAMPLE 3-8 | SAMPLE 3-9 | SAMPLE 3-10 | SAMPLE 3-11 | SAMPLE 3-12 |
| TAPERED ANGLE [°] | — | 0 (VERTICAL) | 0 (VERTICAL) | 0 (VERTICAL) | 45 | 0 (VERTICAL) |
| DIAMETER OF HOLE: L [μm] | 0 | 100 | 120 | 120 | 120 | 120 |
| DEPTH OF GROOVE: D [μm] | 0 | 100 | 100 | 60 | 60 | 150 |
| THINNEST PORTION E [μm] | 150 | 50 | 50 | 90 | 90 | 0 |
| NUMBER OF HOLES | 0 | 93 | 67 | 67 | 67 | 67 |
| LUMINANCE | 1 | 2.19 | 2.32 | 2 | 2.19 | 2.72 |

It can be known that, as shown in Table 4, a luminance is improved when a hole is provided, as a concave portion, on the light emitting surface of the fluorescent member 42. It can also be known that, as clear from the comparison among Samples 3-5 to 3-7 shown in Table 4, a luminance is more increased as the depth of the hole becomes larger. That is, the ratio of the side surface of the hole becomes larger by forming the hole having a larger depth, thereby allowing the light incident on the side surfaces (interfaces) that form the hole to be increased. As a result, it becomes possible to extract outside even the light, which cannot be emitted outside due to total reflection if the surface is flat, thereby allowing a light extraction efficiency to be further improved. The diameter of the hole is preferably 20 μm or more, and more preferably 40 μm or more.

Further, as clear from the comparison among Samples 3-1, 3-2, and 3-4, when the sizes and shapes of the holes are the same as each other, a luminance is more improved as the number of the holes is larger. Further, as clear from the comparison among Samples 3-3 to 3-5, a luminance is more improved as the diameter of the hole is larger. These phenomena can also be explained by an increase in the ratio of the side surface of the hole.

Further, as clear from the comparison between Samples 3-10 and 3-11, when the sizes and shapes of the holes are the same as each other, a luminance is more improved when the tapered angle is large to some extent (e.g., 0° to 60°, preferably approximately 45').

In the aforementioned Examples, the thickness of the fluorescent member in the bottom of the groove or the hole is preferably 90 μm or less, more preferably 70 μm or less, and still more preferably 50 μm or less.

Subsequently, an optimal position where the concave portion is provided will be considered from the relationship with an electrode in a semiconductor light emitting element. In the semiconductor light emitting element 12, an unevenness in brightness is created depending on the shape of the electrode or the light emitting layer, without light being uniformly emitted from the whole surface of the sapphire substrate 18, as illustrated in FIG. 1. Accordingly, for example, when it is intended to obtain white light by color mixing the light emitted by the semiconductor light emitting element and the excited light that has been excited, in the fluorescent member, with the light emitted by the semiconductor light emitting element, uneven color is to be created. In particular, the ratio of the excited light becomes large in the upper area of a region where the light emitted by the semiconductor light emitting element is not generated. Accordingly, in the case of a light emitting module in which a blue semiconductor light emitting element and a yellow fluorescent member are combined together, there are sometimes the cases where color is shifted to yellow in a certain region on the light emitting surface.

Figure 9:
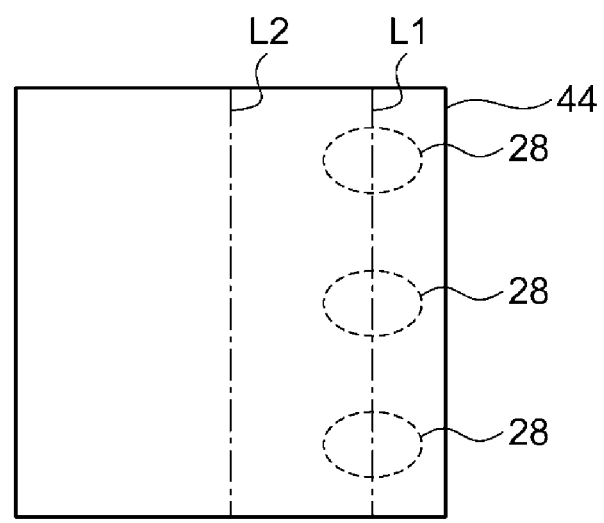
FIG. 9 is a view schematically illustrating the positions of electrodes, when a light emitting module is viewed from the light emitting surface side of a fluorescent member.
Figure 10:
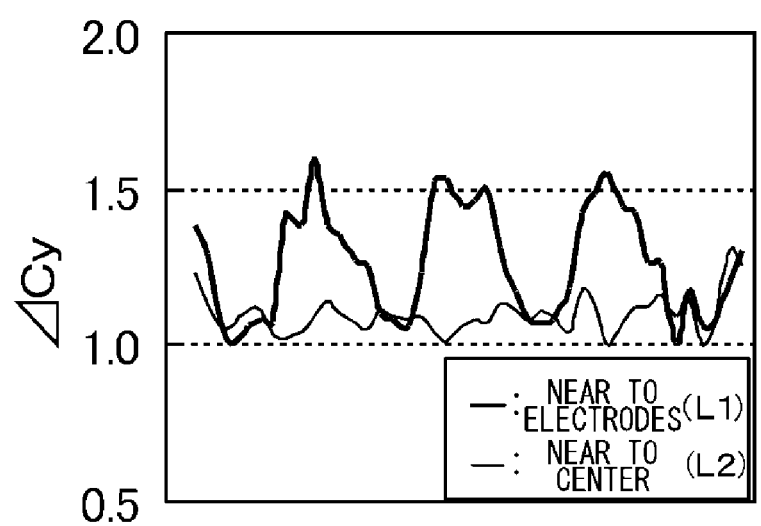
FIG. 10 is a graph showing changes in the chromaticity in the line L1 (near to the electrodes) and in the line L2 (near to the center), which are both illustrated in FIG. 9.

FIG. 9 is a view schematically illustrating the positions of electrodes, when a light emitting module is viewed from the light emitting surface side of a fluorescent member 44, and FIG. 10 is a graph showing changes in the chromaticity in the line L1 (near to the electrodes) and in the line L2 (near to the center), which are both illustrated in FIG. 9. It can be known that, as illustrated in FIG. 10, in the case of the fluorescent member 44 in which a concave portion is not provided, periodical uneven color is created corresponding to the positions of the electrodes.

Figure 11:
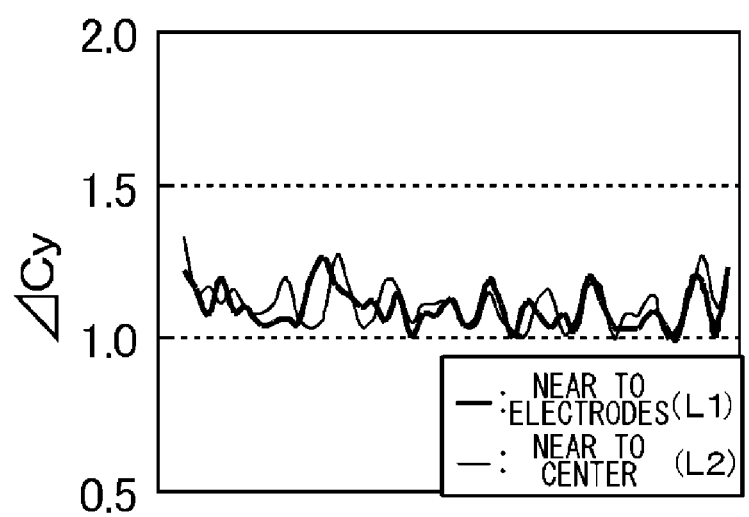
FIG. 11 is a graph showing changes in the chromaticity in the fluorescent member illustrated in FIG. 7.
Figure 12:
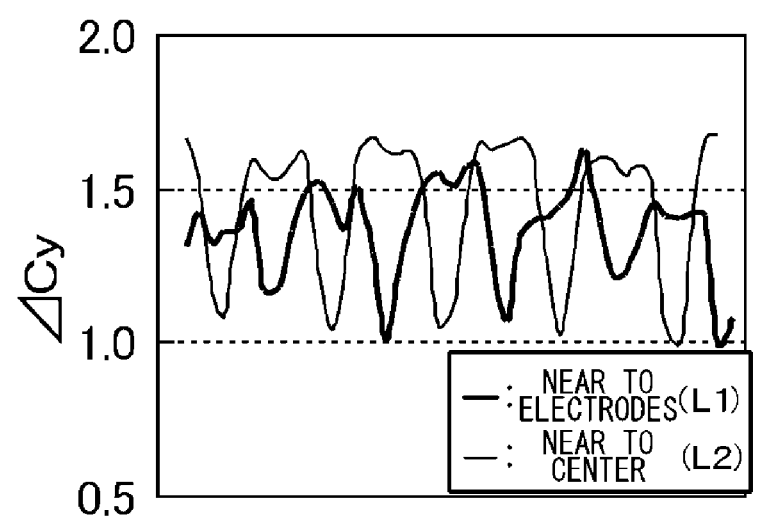
FIG. 12 is a graph showing changes in the chromaticity in the fluorescent member illustrated in FIG. 8.

Therefore, in view that an increase in the ratio of the excited light, which is emitted by a fluorescent member located in the upper area of an electrode, causes uneven color, the present inventors have thought that, in a fluorescent member formed of an inorganic material in which internal scattering is little, light scattering may be prompted by providing a concave portion. FIG. 11 is a graph showing changes in the chromaticity in the fluorescent member 40 illustrated in FIG. 7. FIG. 12 is a graph showing changes in the chromaticity in the fluorescent member 42 illustrated in FIG. 8. It can be known from these results that, in particular, in a light emitting module including the fluorescent member 42 in which a groove that has been processed to be tapered is formed as a concave portion, uneven color is drastically reduced.

Uneven color can also be reduced by reducing the fluorescent member in the upper area of an electrode. That is, it can be reduced, by reducing the excited light from a fluorescent member located at a position facing at least part of an electrode, that chromaticity may be shifted to the excited light side. When a plurality of holes are provided as concave portions in this case, it becomes easier to form the concave portions to be scattered at desired positions, in particular, at the positions corresponding to the positions of electrodes.

Accordingly, it is better to form the concave portion 14b at a position facing at least part of the electrodes 26 and 28 in the semiconductor light emitting element 12, as the fluorescent member 14 illustrated in FIG. 1.

Figure 13:
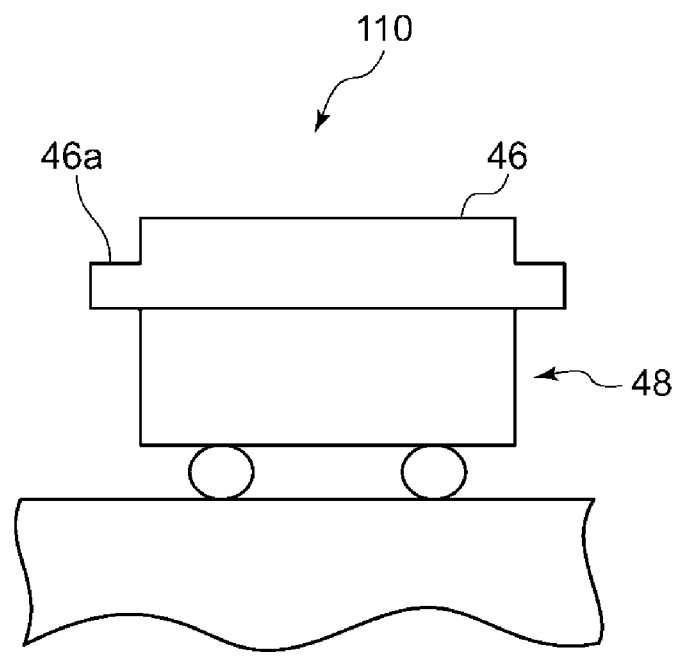
FIG. 13 is a schematic view illustrating a variation of a light emitting module according to the present embodiment.

FIG. 13 is a schematic view illustrating a variation of a light emitting module 110 according to the present embodiment. As illustrated in FIG. 13, when the area of a fluorescent member 46 is larger than that of a semiconductor light emitting element 48, the ratio of excited light becomes large on the light emitting surface of the fluorescent member in a region 46a outside the semiconductor light emitting element 48, and hence uneven color is likely to be created in the same way as stated before. That is, chromaticity is to be shifted at the outer circumference of a projected pattern of the light emitting module 110.

Accordingly, in the fluorescent member 46, a concave portion is formed in the region 46a outside the outer circumference of the semiconductor light emitting element 48 that the fluorescent member 46 faces. Thereby, the fluorescent member in that area is reduced and uneven color can be reduced in the whole fluorescent member.

Figure 14:
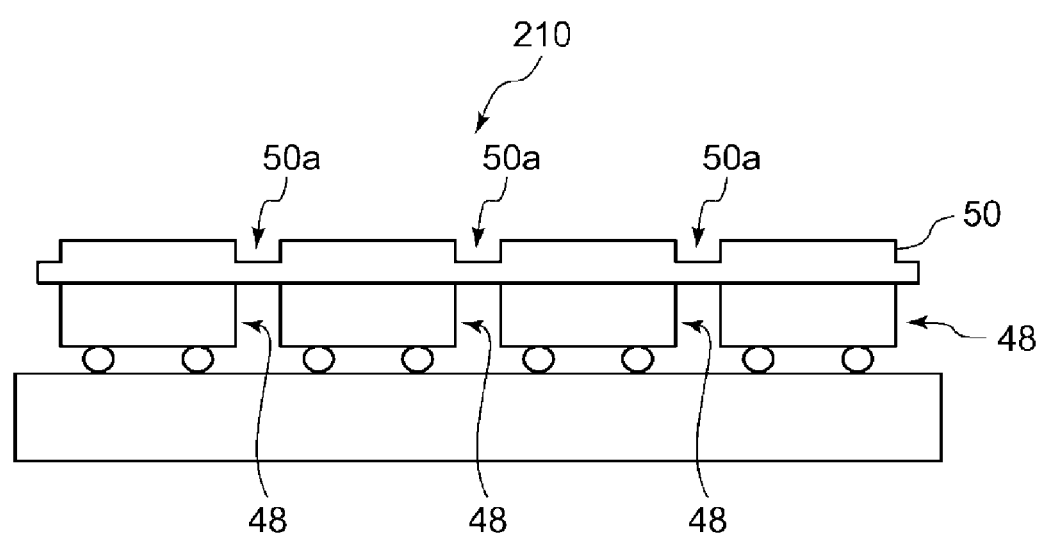
FIG. 14 is a schematic view illustrating a light emitting module including a plurality of semiconductor light emitting elements.

FIG. 14 is a schematic view illustrating alight emitting module 210 including a plurality of semiconductor light emitting elements 48. A fluorescent member 50 is a plate-shaped member to be mounted on the plurality of the semiconductor light emitting elements 48. In such the light emitting module 210, a gap is created between the adjacent semiconductor light emitting elements 48, and hence the ratio of the excited light included in the emitted light becomes large in a region 50a in the fluorescent member 50 located above the gap. Accordingly, uneven color can be reduced by proving a concave portion in the region 50a in the fluorescent member facing the gap between the semiconductor light emitting elements 48.

The present invention has been described above with reference to the aforementioned embodiments and the respective examples, but the invention is not limited to the aforementioned embodiments and examples, and variations in which each component of the embodiments and examples is appropriately combined or substituted are also encompassed by the invention. Variations in which the combinations or the orders of processing in the embodiments and examples are appropriately changed or various modifications, such as design modifications, can be made with respect to the embodiments and examples based on the knowledge of those skilled in the art. Such modified embodiments can also fall in the scope of the invention.

The light emitting module according to the aforementioned embodiments is one in which a semiconductor light emitting element is flip-chip mounted on a wiring board, but the inventions of the present application can be applied even to a light emitting module in which a semiconductor light emitting element and a wiring board are connected together by wire bonding.

INDUSTRIAL APPLICABILITY

A light emitting module according to the present invention can be used in various lamps, for example, a lighting lamp, display, automotive lamp, signal, etc.

What is claimed is:

1. A plate-shaped fluorescent member configured to convert a wavelength of light emitted by a semiconductor light emitting element, wherein
   the fluorescent member is formed of an inorganic material having a refractive index of at least 1.5 and a light transmittance at the emission peak wavelength of the semiconductor light emitting element of less than 20%, and wherein
   a concave portion is formed, of surfaces of the fluorescent member, on a surface on a side where the light in the semiconductor light emitting element is mainly emitted,
   a depth of the concave portion is at least 5 μm,
   the concave portion comprises a plurality of scattered holes, and
   a thickness of the fluorescent member at a bottom of the concave portion is 90 μm or less.

2. The fluorescent member according to claim 1, wherein a minimum of the light transmittance of the light having a wavelength of 380 nm to 500 nm is less than 20%.

3. A light emitting module comprising:
   a semiconductor light emitting element; and
   a fluorescent member provided so as to face the light emitting surface of the semiconductor light emitting element and configured to convert a wavelength of light emitted by the semiconductor light emitting element, wherein
   the fluorescent member is formed of an inorganic material having a refractive index of at least 1.5 and a light transmittance at an emission peak wavelength of the semiconductor light emitting element of less than 20%,
   a concave portion is formed, of surfaces of the fluorescent member, on a surface on a side where the light in the semiconductor light emitting element is mainly emitted,
   a depth of the concave portion is at least 5 μm,
   the concave portion comprises a plurality of scattered holes, and
   a thickness of the fluorescent member at a bottom of the concave is 90 μm or less.

4. The light emitting module according to claim 3, wherein in the fluorescent member, the concave portion is formed at a position facing at least part of an electrode in the semiconductor light emitting element.

5. The light emitting module according to claim 3, wherein in the fluorescent member, the concave portion is formed in an area outside an outer circumference of the semiconductor light emitting element that the fluorescent member faces.

* * * * *